United States Patent [19]
Petrmichl et al.

[11] Patent Number: 5,653,812
[45] Date of Patent: Aug. 5, 1997

[54] METHOD AND APPARATUS FOR DEPOSITION OF DIAMOND-LIKE CARBON COATINGS ON DRILLS

[75] Inventors: Rudolph Hugo Petrmichl, Center Valley; Ray Hays Venable, Allentown; Rickey Leonard Salter, Northampton; Victor M. Zeeman, Jr., Bangor, all of Pa.

[73] Assignee: Monsanto Company, St. Louis, Mo.

[21] Appl. No.: 534,188

[22] Filed: Sep. 26, 1995

[51] Int. Cl.⁶ .................................................. C23C 16/00
[52] U.S. Cl. ...................... 118/723 E; 118/728; 427/578
[58] Field of Search .................... 118/723 E, 723 ER, 118/728; 156/345; 204/298.11; 427/569, 578

[56] References Cited

U.S. PATENT DOCUMENTS

| | | | |
|---|---|---|---|
| 4,382,100 | 5/1983 | Holland | 427/38 |
| 5,009,705 | 4/1991 | Yoshimura et al. | 75/240 |
| 5,022,801 | 6/1991 | Anthony et al. | 408/144 |
| 5,096,736 | 3/1992 | Anthony et al. | 427/38 |
| 5,256,206 | 10/1993 | Anthony et al. | 118/723 R |
| 5,258,206 | 11/1993 | Hayashi et al. | 427/577 |
| 5,478,429 | 12/1995 | Komino et al. | 156/345 |
| 5,482,602 | 1/1996 | Cooper et al. | 204/192.11 |
| 5,508,368 | 4/1996 | Knapp et al. | 427/534 |

FOREIGN PATENT DOCUMENTS

| | | |
|---|---|---|
| 0470447A1 | 2/1992 | European Pat. Off. |
| 0528592A1 | 2/1993 | European Pat. Off. |
| 215923A1 | 11/1984 | Germany |
| 215922A1 | 11/1984 | Germany |
| 61-146411 | 7/1986 | Japan |
| 1-257196 | 10/1989 | Japan |
| 2-48106 | 2/1990 | Japan |
| 7-80713 | 3/1995 | Japan |
| 2122224 | 1/1984 | United Kingdom |
| 344022A | 10/1992 | WIPO |

OTHER PUBLICATIONS

Halverson, W., "Plamsa assisted chmical vapor deposition on 'three-dimensional' substrates", J. Vac. Sci. Technol. A, Vac. Surf. Films (USA), vol. 10, No. 3, abstract.

Meneve, J., "Si H films and their possibilities and limitations for tribological applications", Diamond films technology (Japan), vol. 4, No. 1, abstract.

Primary Examiner—John Niebling
Assistant Examiner—Joni Y. Chang
Attorney, Agent, or Firm—Coudert Brothers

[57] ABSTRACT

The invention is a method and apparatus for the RF plasma deposition of diamond-like carbon (DLC) and related hard coatings onto the surface of drills; especially microdrills such as printed circuit board drills and printed wire board drills, using a mounting means connected to a source of capacitively coupled RF power. A key feature of the apparatus is that the drills to be coated are the only negatively biased surfaces in the capacitively-coupled system.

According to the method, the surface of the drills to be coated are first chemically de-greased to remove contaminants, and inserted into the electronically masked coating fixture of the present invention. The electronically masked fixture includes the powered electrode, the portion of the drills to be coated, an electrically insulated spacer, and an electrically grounded shield plate. Next, the loaded fixture is placed into a plasma deposition vacuum chamber, and the air in said chamber is evacuated. Gas is added to the vacuum chamber, and a capacitive RF plasma is ignited, causing the surface of the drills to be sputter-etched to remove residual contaminants and surface oxides, and to activate the surface. Following the sputter-etching step, a silicon-containing material layer is deposited by capacitive RF plasma deposition. This silicon-containing material layer may be either an adhesion layer for subsequent deposition of DLC, or may be "Si-doped DLC" ("Si-DLC"). If this silicon-containing layer is an adhesion layer, the next step in the process is deposition of a top layer of either DLC or Si-DLC by capacitive RF plasma deposition.

23 Claims, 3 Drawing Sheets

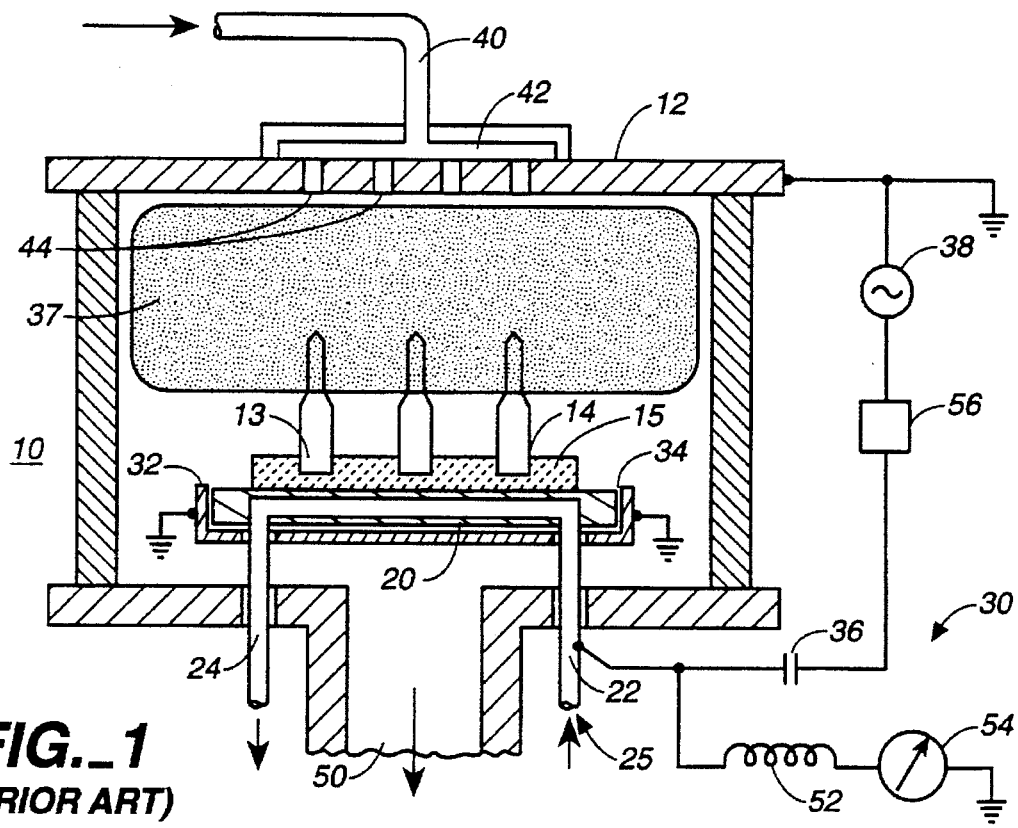
FIG._1
*(PRIOR ART)*
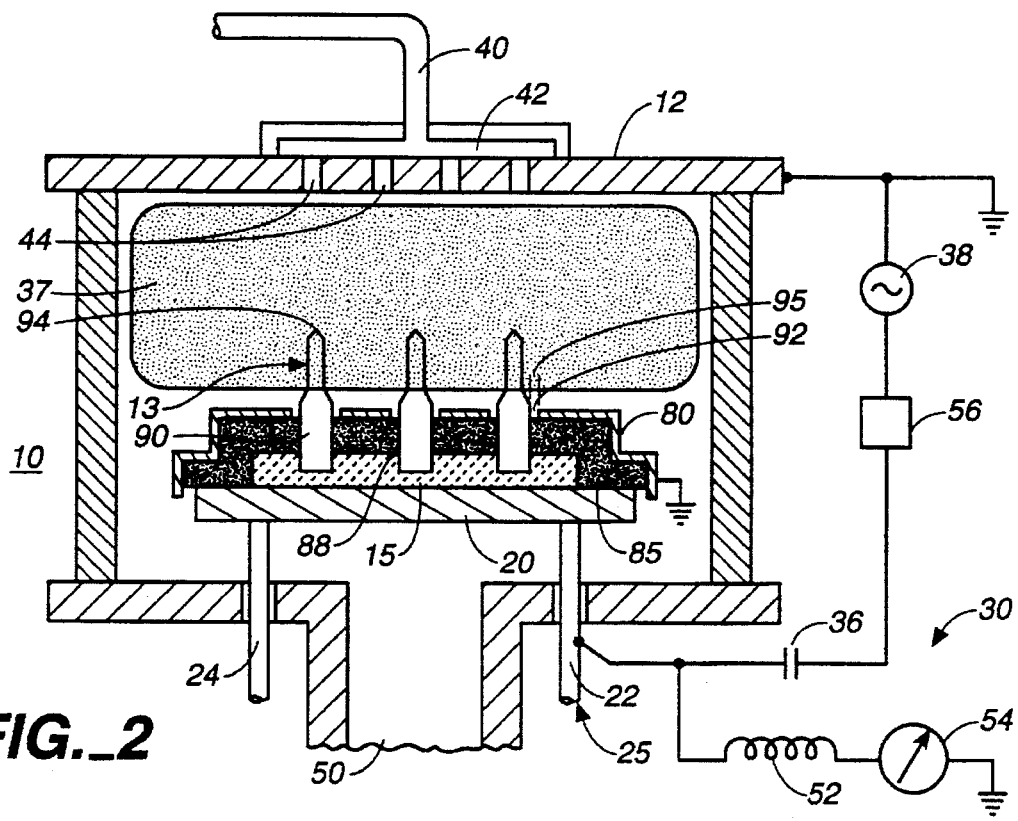
FIG._2

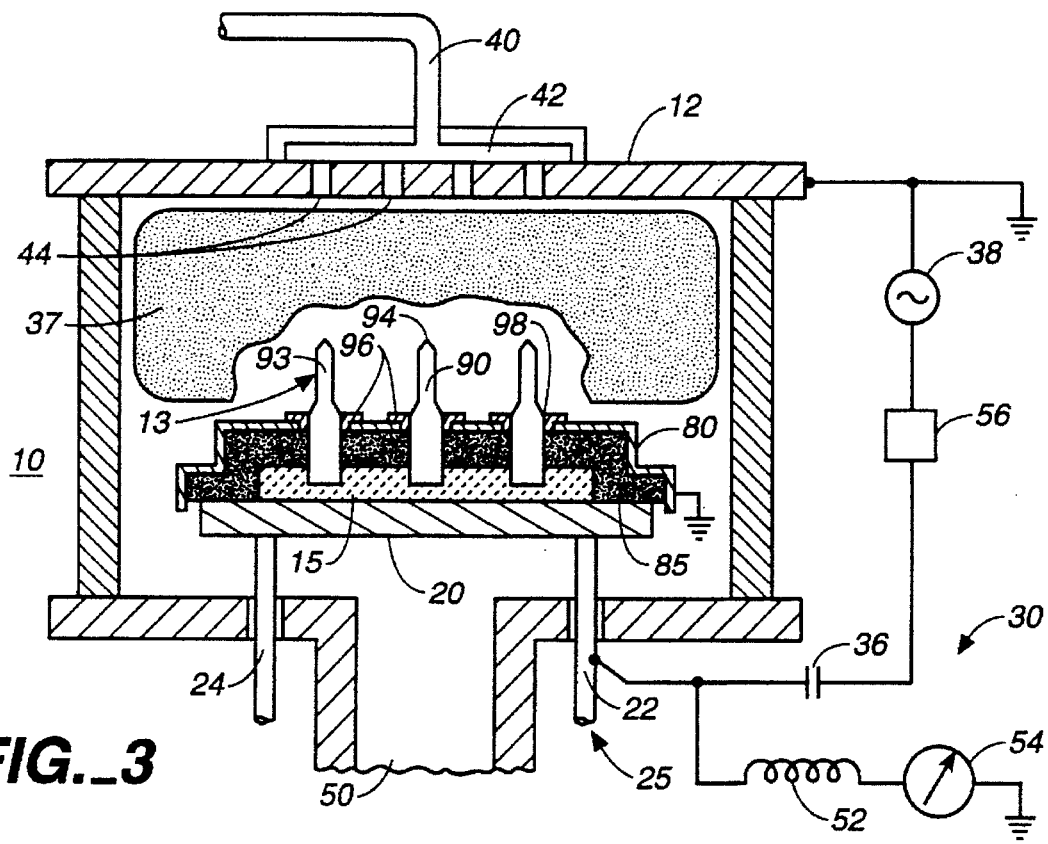
FIG._3
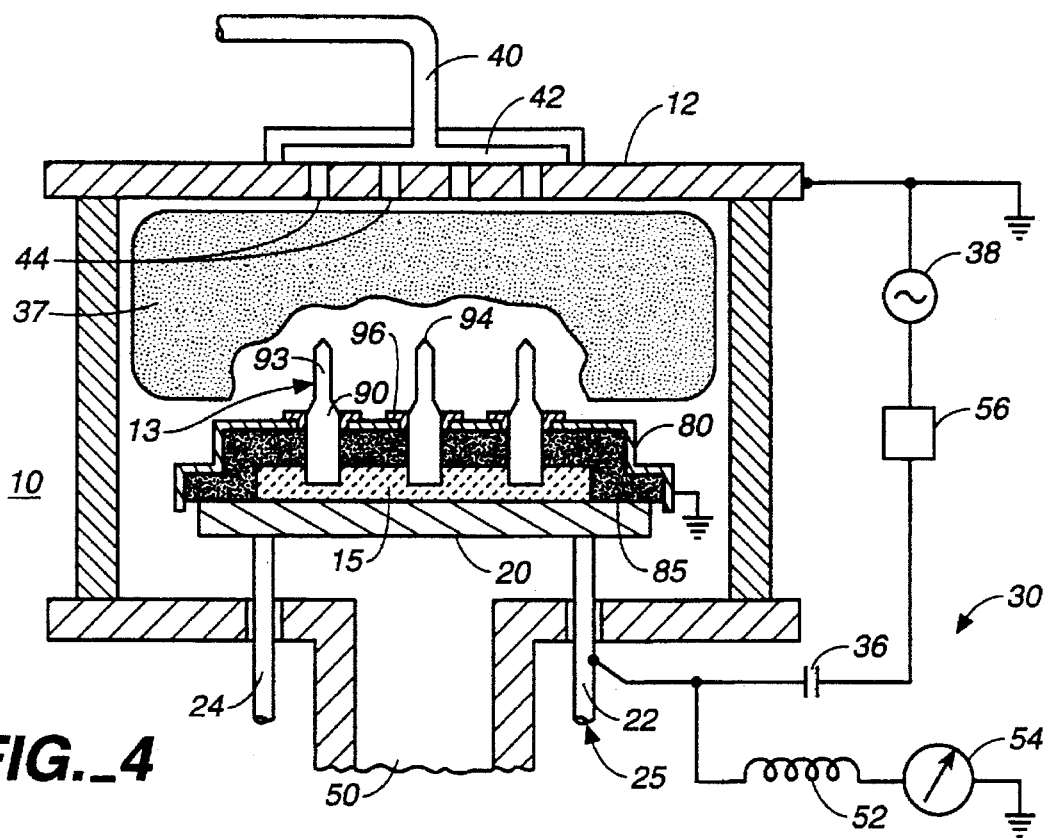
FIG._4

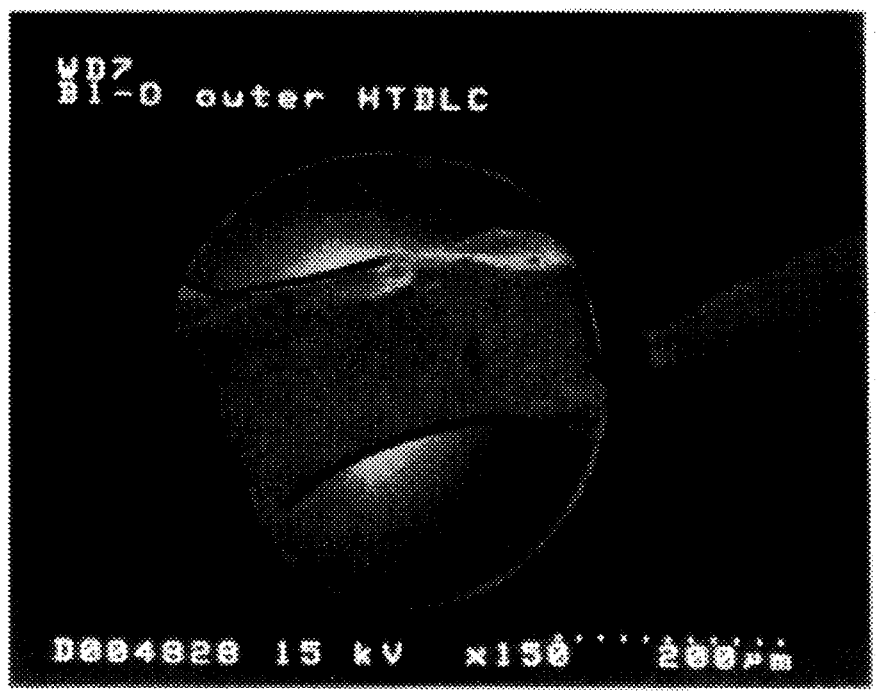
FIG._5
FIG._6

METHOD AND APPARATUS FOR DEPOSITION OF DIAMOND-LIKE CARBON COATINGS ON DRILLS

FIELD OF THE INVENTION

This invention relates to the deposition of diamond-like carbon (DLC) and related coatings onto the surface of elongated substrates, e.g. drills, for the purpose of improving the performance of such substrates. The invention is particularly useful for depositing DLC coatings onto microdrills for improving their cutting performance in drilling small holes in materials such as printed circuit boards.

BACKGROUND OF THE INVENTION

The prior art recognizes that improved performance of tools, such as drills, can be obtained by application of ceramic coatings (oxides, carbides, nitrides), polycrystalline diamond coatings, and diamond-like carbon coatings onto the cutting surface of the tools. While polycrystalline diamond coatings deposited by chemical vapor deposition (CVD) exhibit extreme hardness (80–100 Giga Pascals (GPa)), they must be deposited at high substrate temperatures (>700° C.), and they exhibit high surface roughness and often poor adhesion to the substrate. Amorphous diamond-like carbon (DLC) coatings are less hard (10–50 GPa), but can be applied at low substrate temperatures (<400° C.). In addition, DLC coatings are smooth, have a low coefficient of friction, and can exhibit high adhesion strength to the substrate. Therefore, DLC coatings have advantages over CVD diamond coatings for many tool applications.

The following references are indicative of the prior art in chemically vapor deposited (CVD) polycrystalline diamond coatings on drills. In U.S. Pat. No. 5,009,705A, Yoshimura et al. disclose a microdrill bit with a CVD polycrystalline diamond coating. In U.S. Pat. Nos. 5,022,801 and 5,096,736, Anthony et al. discuss high temperature CVD diamond coatings on slotted twist drills. In U.S. Pat. No. 5,256,206, Anthony et al. describe a high temperature CVD reactor suitable for coating drills. In JP 01257196 A2, Ito et al. disclose a method for uniform coating of a drill with CVD diamond by precession motion of the drill during deposition. In EP-470447A1, Anthony et al. disclose a heated tubular reactor for CVD diamond deposition on drill bits and similar tools and in EP-528592A1, Iacovangelo describes a masking technique to produce selected area deposition of CVD diamond onto a twist drill.

The following references are indicative of the prior arc of DLC coatings on drills. In JP0248106, Katsumata discloses a DLC coating on drills. In DD-215922A1, Bollinger et al. describe a method for uniform coating deposition on a twist drill. In this method, an independent direct current (DC) electrical field is used near the substrate, optionally modulated with an alternating current (AC) electrical field to direct the coating ion flow from the source to the cathode substrate. In DD-215923A1, Bollinger et al. describe an apparatus for ion coating a spiral drill containing a positively charged electrode shape, preferably a wire, to direct the ion flux to the drill surface, using a positive shielding electrode between the substrate holder and the electrode shape surrounding the drill, e.g. a helical-shaped anode surrounding the drill. In GB 2122224A1, Goode et al. disclose an ion beam method for applying a hard carbon coating onto tungsten carbide drills. Finally in, JP 611464112A, Tobioka et al. discuss deposition of a sputtered Ti adhesion layer, followed by a plasma-deposited carbon coating on tungsten carbide drills.

The prior art methods have not been able to achieve high quality DLC coatings on drills, especially not on printed circuit board drills, while simultaneously meeting the requirements of a robust, high throughput production process.

SUMMARY OF THE INVENTION

The invention is a method and apparatus for the deposition of low friction, abrasion resistant DLC and related hard coatings onto the surface of elongated substrates, e.g. drills and tubes, for the purpose of improving cutting performance of the drills and the wear resistant characteristics of the tubes.

The apparatus of the present invention includes a radio frequency plasma chamber for the deposition of a protective, abrasion-resistant coating on elongated substrates, an electrically conducting mounting block, holder, carrier, fixture, or other means for holding the substrate, positioned within the plasma chamber and used for mounting the substrates, an electrically conducting shield plate, which is maintained at ground potential, and an electrically insulating (dielectric) spacer. The mounting block is connected to a source of capacitively coupled radio frequency (RF) power to induce a DC bias voltage in the substrate and to effectively coat the exposed surface of the substrate. The substrates to be coated are the only negatively biased surfaces in this capacitively-coupled system. The shield plate and the dielectric spacer, occupying the space between the conductive mounting block and the grounded shield plate, form an "electronic masking" unit to prevent the RF plasma deposited coating on the unexposed portion of the substrate as well as on the mounting block and the electrode. Specifically, the shield plate terminates the RF field, reducing the RF power density over the shield plate. The electrically grounded shield plate has holes through which the substrates extend into the RF plasma generated in the chamber.

According to the method of the present invention, the surfaces of the substrates to be coated are first chemically de-greased to remove contaminants. In the second step, the substrates are inserted into the coating fixture of the present invention, then the loaded fixture is placed into a plasma deposition vacuum chamber and the appropriate electrical connections are made as described in the discussion of the apparatus of this invention. In the third step, the air in the chamber is evacuated. In the fourth step, a non-depositing gas, such as Ar, is added to the vacuum chamber, and a capacitive RF plasma is ignited, causing the surfaces of the substrates to be bombarded with energetic ions (sputter-etched) to assist in the removal of residual hydrocarbons and surface oxides, and to activate the surfaces. After each of the substrate surfaces has been sputter-etched, a silicon-containing material layer is deposited by capacitive RF plasma deposition. This silicon-containing material layer may be either an adhesion layer for subsequent deposition of DLC, or may be "Si-doped DLC" ("Si-DLC"). If this silicon-containing layer is an adhesion layer, the next step in the process is deposition of a top layer of either DLC or Si-DLC by capacitive RF plasma deposition. Once the chosen thickness of the DLC coating layer or the Si-DLC top coating layer has been achieved, the deposition process is terminated by extinguishing the plasma. Finally, the vacuum chamber pressure is increased to atmospheric pressure, and the coated substrates are removed from the vacuum chamber.

BRIEF DESCRIPTION OF THE DRAWINGS

Further features and advantages will become apparent from the following and more particular description of the preferred embodiment of the invention, as illustrated by the accompanying drawings, in which like reference characters generally refer to the same parts or elements, and in which:

FIG. 1 is a diagrammatic view, partially in cross-section, of a conventional capacitively coupled planar RF plasma DLC deposition apparatus and is labeled "PRIOR ART";

FIG. 2 is a diagrammatic view, partially in cross-section, of one embodiment of a capacitively coupled RF plasma deposition apparatus used for application of DLC and related hard coatings onto substrates in accordance with the present invention;

FIG. 3 is a diagrammatic view, partially in cross-section, of another embodiment of a capacitively coupled RF plasma deposition apparatus used for application of DLC and related hard coatings onto substrates in accordance with the present invention;

FIG. 4 is a diagrammatic view, partially in cross-section, of another embodiment of a capacitively coupled RF plasma deposition apparatus used for application of DLC and related hard coatings onto substrates in accordance with the present invention;

FIG. 5 is a photomicrograph (taken at 150× magnification using a secondary electron microscope) of a fracture cross-section of a Si-DLC coated drill prepared in accordance with the method of the present invention, illustrating the coating uniformity of drills located on the outer edge of the mounting block; and FIG. 6 is a photomicrograph (taken at 150× magnification using a secondary electron microscope) of a fracture cross-section of a Si-DLC coated drill prepared in accordance with the method of the present invention, illustrating the coating uniformity of drills located near the center of the mounting block.

DETAILED DESCRIPTION OF THE INVENTION

Various aspects of the present invention may be more easily understood by reference to the FIGS. 1–6.

FIG. 1 illustrates a prior art apparatus for capacitively coupled RF plasma deposition, in accordance with Holland et al., U.S. Pat. No. 4,382,100. Within an electrically grounded metal vacuum chamber or a glass vacuum chamber 10 with electrically grounded electrode 12, substrates 13 (for example, drills, tubes, and rods) are mounted either in recessed holes directly in the powered electrode, or equivalently in recessed holes 14 in electrically conductive mounting block 15 which in turn rests on powered electrode 20. Powered electrode 20 is shown with cooling water inlet 22 and cooling water outlet 24 of a typical cooling system 25 for RF chamber 10. RF power circuit 30 is electrically connected to grounded electrode 12 and powered electrode 20 via cables or connectors as shown by means well known in the art. Electrically grounded dark space shield 32 is separated from powered electrode 20 by a small gap 34. DC blocking capacitor 36 in RF power circuit 30 allows the entire electrode assembly, i.e., substrates 13, mounting block 15 and powered electrode 20, to develop a negative voltage (also known in the art as DC self-bias voltage) upon ignition of plasma 37 by application of suitable RF power from RF generator 38 in the presence of process gas. The process gas which may include precursor gases for deposition pass through gas line 40 into shower head distributor 42 and out through ports 44 into chamber 10. The effluent gases are exhausted through exhaust pumping port 50. RF blocking inductor 52 in circuit 30 permits measurement of the DC bias voltage via voltmeter 54. Matching network 56 in circuit 30 is tuned to assure optimum delivery of RF power into plasma 37. Typical process operating conditions include gas pressure in the range of 0.001 Torr to 0.5 Torr, RF frequency of 13.56 MHz, peak-to-peak RF voltages of 500–1000 Volts, and DC self-bias voltages of −100 to −1,000 Volts.

In nearly all capacitively coupled RF plasma systems, the surface area of grounded surfaces is substantially larger than the surface area of powered electrode 20. In such asymmetric systems, ion bombardment energies and fluxes are much larger on the powered electrode than they are on the grounded surfaces including grounded electrode 12. Bombardment by positive ions from an inert gas (e.g. Ar) plasma results in sputter-etching of the exposed surfaces of the substrate assembly which includes substrates 13, mounting block 15 and powered electrode 20. Likewise, ion bombardment by positive ions of the precursor gases, such as hydrocarbon gases (e.g. methane, cyclohexane, or butane), results in deposition of a DLC coating on all exposed surfaces of the substrate assembly. This is described in detail in U.S. Pat. No. 4,382,100, which description is incorporated herein by reference. It is significant to emphasize that in the '100 patent not only is there a deposition on the substrate, but also on the exposed surfaces of the substrate holder and powered electrode. If allowed to accumulate during multiple deposition runs, the coatings on the fixture and electrode, which are under compressive stress due to the ion bombardment, eventually disbond. The resulting debris and dust can contaminate the substrate surface and lead to poor coating coverage. Additionally it is well known that the geometry of the electrode assembly in the prior art configuration strongly influences the characteristics of the plasma near the substrates, and consequently deposition rate and quality of the DLC coating on the substrates.

Deposition on the edges and backside of the powered electrode is commonly avoided in commercial capacitive RF systems, by the use of dark space shield 32 shown in FIG. 1. As illustrated, grounded metal shield 32 is separated from powered electrode 20 by thin vacuum gap 34. Gap 34 is thinner than the width of the plasma dark space adjacent the exposed surface of powered electrode 20, and thus a self-sustaining plasma will not develop in gap 34. There are numerous problems associated with the use of dark space shield 32. They include disruptive short-circuits or arcs, which can occur through misalignment of the shield or through build up of non-insulating deposits or debris in dark space gap 34, or during operation at high chamber pressure.

The usual approach in the prior art to masking selected surfaces on the work piece, substrate holder, or powered electrode is to place a dielectric material, such as Kapton tape, in direct physical contact with the surface where coating is unwanted. This method will be referred to herein as dielectric masking. The disadvantage of this prior art approach is that unless the dielectric mask is impractically thick, the RF fields penetrate through the mask and intensify the local plasma at its outer surface. Although the dielectric mask attenuates the RF fields, the masked areas none-the-less influence the gross plasma characteristics and thus the deposition rate and coating quality on the substrates. Additionally, sputter-etching of the mask during preclean can lead to redeposition of the dielectric material on the exposed substrate surface and thereby degrade coating adhesion. Furthermore, dielectric masks or polymer masks, which are often used because they are flexible and can be easily molded, have much lower cohesive strength than do the metal substrates (such as drills) and are thus much more susceptible to coating loss.

The present invention circumvents the problems of the conventional approaches to fixturing and dielectric masking. Three embodiments of the present invention are shown in FIGS. 2, 3 and 4. In one embodiment shown in FIG. 2, deposition is prevented on selected surfaces of the substrate 13, substrate holder or mounting block 15, and powered electrode 20 by covering the selected surfaces with electrically conducting plate 80 which is maintained at ground potential. An electrically insulating (dielectric) material is used as dielectric spacer 85 between masked powered electrode 20 and grounded shield plate 80. Dielectric spacer 85 has a plurality of channels 88 through which shanks 90 of drill substrates 13 pass. Similarly, shield plate 80 has a plurality of openings 92 through which shanks 90, flutes 93, and tips 94 of drill substrates 13 pass and extend into plasma 37. Spacer 85 prevents short circuits or arcs from occurring between grounded plate 80 and the masked area under dielectric spacer 85. However, one of the critical elements of the apparatus of the present invention is the function of grounded shield plate 80 which terminates the RF fields penetrating outward through dielectric spacer 85. The masking technique of the present invention is referred to herein as electronic masking.

Although the exact diameters of openings 92 in plate 80 is not critical, care should be made to take the diameter of substrate 13 into consideration. On the one hand, the width of each of annular spaces 95 between the inner edge of opening 92 and the surface of shank 88 should be small to minimize deposition on the exposed dielectric of spacer 85 adjacent opening 92. On the other hand, this width should be sufficiently large to avoid short circuits through direct physical contact between the electrically conducting materials, e.g. metal, of shield plate 80 and drill substrate 13.

The dielectric spacer should be made from a material with high DC resistivity and good thermal stability. To achieve optimum performance, however, one must additionally choose a material with both a small dielectric constant and a small dissipation factor at the frequency applied. The first parameter is related to the heat losses in the power circuit, and the second to the heat losses in the dielectric itself. Examples of suitable dielectrics include, but are not limited to, alumina, boron nitride, teflon, and polycarbonate.

In another embodiment of the present invention shown in FIG. 3, additional dielectric layer 96 having orifices 98 through which shanks 90 pass is provided to cover annular spaces 95 of grounded shield plate 80. Equivalently, the dielectric layer 96 may cover the entire surface of grounded shield plate 80. This assures that the electronic mask adjoining the exposed surfaces of the substrates to be coated are covered in such a manner that annular spaces 95 are fully encased by the electrically insulating material. Dielectric layer 96 prevents short-circuits or arcs which may occur inadvertently in the first embodiment due to (i) misalignment of the electronic mask (ii) build up of non-insulating deposits or debris in annular spaces 95 between the grounded plate and the substrate and (iii) breakdown in spaces 95 at high operating pressure.

In yet another embodiment of the present invention shown in FIG. 4, dielectric layer 96 having orifices 98 through which shanks 90 and tips 94 pass is shaped to conform to the tapered region of the drills between shanks 90 and flutes 93 so that coating deposition is restricted to shanks 90 and tips 94.

Electronic masking permits one to selectively "deactivate" surfaces on the powered electrode, substrate holder and the substrates. From the perspective of the plasma, the masked regions become part of the grounded electrode and as such have much less influence on the characteristics of the plasma above the substrates. Consequentially, the size and shape of the substrate assembly under the electronic mask has minimal influence on the deposition rate and the quality of the DLC coating deposited on the substrates.

The embodiments of the present invention were found to provide other dramatic improvements over the capacitive RE plasma techniques of the prior art. These improvements include:

(a) complete absence of undesirable deposition on the powered electrode and substrate holders, and a greatly reduced rate of spurious deposition on the electronic mask and other grounded surfaces;

(b) much lower propensity for dust and debris formation and therefore longer operation between chamber cleanup due to reduced ion bombardment on the mask and consequently lower stress in spurious coatings;

(c) less electrical power consumption, due to decreased area of RF active surfaces;

(d) less total heat generated, and therefore lower substrate temperatures resulting in improved coating adhesion and less degradation of the mechanical properties of the substrates; and (e) improved part-to-part coating uniformity within a single run.

In addition to these improvements over the prior art, the apparatus and method of the present invention retains the advantages of the conventional capacitive RF plasma technique over other DLC deposition methods, such as ion beam deposition, namely:

(f) simple, stationary fixturing of the drills for coating, without the need for rotation or moving parts;

(g) excellent coating thickness uniformity on the drills, without the need for using specially shaped electrodes;

(h) excellent coating coverage inside the flutes of drills, as well as on exterior surfaces;

(i) high packing density of drills within a single coating run, resulting in high manufacturing throughput and low production cost;

(j) high coating deposition rate; and (k) ease of production of doped DLC, e.g., containing heteroatoms such as Si, or other metals, or undoped DLC (composed of carbon and hydrogen only) and other hard coatings.

Suitable adhesion layers contain silicon, and may contain one or more of the following elements: hydrogen, carbon, nitrogen, oxygen, and traces of inert gas such as argon. The silicon-containing adhesion layer is readily made by RF plasma deposition from a variety of volatile organosilicon compounds, which may or may not have other heteroatoms. Examples of suitable precursors include, but are not limited to, silane, disilane, tetramethylsilane, diethylsilane, tetraethoxysilane, hexamethylsiloxane and hexamethylsilazane. These precursor gases may be blended with an inert gas, such as argon. Pure inorganic adhesion layers can be also be deposited in a capacitive RF system by sputter deposition from a target mounted on a separate RF electrode.

Following completion of the deposition of the silicon-containing interlayer to the desired thickness, a top layer of low friction, abrasion resistant coating material such as DLC, Si-DLC, or metal-doped DLC is deposited by the RF plasma deposition method of the present invention. Examples of suitable silicon-containing precursors for RF plasma deposition of Si-DLC layers include, but are not limited to organosilicon compounds such as silane, disilane, diethylsilane, and tetramethylsilane. These silicon-containing precursors may be blended with hydrocarbon precursors (e.g. methane, cyclohexane) and inert gas (e.g. argon) at various concentrations to control the silicon concentration in the Si-DLC coating. Metal-doped DLC coatings may be deposited by a mixture of a suitable metal-containing precursor gas (such as an organometallic compound), which may be blended with hydrocarbon precursors and inert gas. Alternatively, metal-doped DLC coatings may be made by deposition from a hydrocarbon precursor gas with simultaneous sputter deposition of metal atoms from a metallic sputtering target. Deposition of the DLC, Si-DLC, or metal-doped DLC top layer immediately after completion of the interlayer deposition step minimizes the possibility for re-contamination of the interlayer surface with vacuum plasma chamber residual gases or other contaminants. Thicker low friction, abrasion resistant layers (e.g. DLC, Si-DLC, or metal-doped DLC) are generally preferable in terms of providing increased protection against wear and corrosion, although low friction and outstanding wear and corrosion resistance is also obtained by RF plasma deposited DLC coatings at low thickness.

Once the chosen thickness of the low friction, abrasion resistant top layer has been achieved, the RF plasma deposition process on the drills or other substrates is terminated, the vacuum chamber pressure is increased to atmospheric pressure, and the coated drills are removed from the vacuum plasma chamber.

The examples and discussion which follow further illustrate the superior performance of the method and apparatus of the present invention. The examples are for illustrative purposes and are not meant to limit the scope of the claims in any way.

EXAMPLES

Examples 1 and 2 describe two deposition runs of DLC coatings on twist drills and rods, the first with a fixture and powered electrode completely exposed as in the prior art, and the second with their surfaces electronically masked. By comparison, Example 2 produced much lower fixture and substrate temperatures, and greatly reduced levels of dust and debris.

Example 1

(Control 1)

A conventional glass walled parallel-plate RF plasma deposition system, with a 17 cm diameter water-cooled powered electrode, was used to deposit DLC on one stainless steel twist drill and one stainless steel rod. The substrates, both 0.3 cm in diameter and 10 cm long, were mounted horizontally in an aluminum mounting block (2.5 cm wide×3.8 cm high×10 cm long). The substrates were inserted through two widely spaced holes which had been drilled through the width of the block. With the block in place on the electrode, the drills were oriented horizontally, approximately 2.5 cm above and parallel to the electrode surface. Small Kapton tape masks were placed around the perimeter of the rod and the shank of the drill. The purpose of the Kapton masks was to generate a well defined coating step, which can be measured by a profilometer to determine the coating thickness. After loading the fixture, the chamber was evacuated. A flow of 28 sccm argon was introduced in the chamber and a plasma was ignited. The electrode assembly was sputter-cleaned under constant a plasma conditions (21 mTorr pressure, 300 watts RF power, and −550 V DC bias). After approximately 22 minutes of sputter-cleaning, a silicon-based adhesion layer (containing silicon, carbon, and hydrogen) was deposited by mixing 17 sccm of diethylsilane with the argon. Two minutes later DLC deposition was initiated by first adding 105 sccm cyclohexane, and then shutting off both the diethylsilane and argon flows. The DLC deposition step lasted 20 minutes during which the DC bias was −490 V. The chamber was immediately vented at the end of the run. Although the electrode was cold to the touch, both the mounting block and substrates were too hot to touch. A black coating was deposited on the block and on the electrode, but the coating began to spall during the run. The coating on the substrates nearly spalled off completely, and no thickness measurement was possible. The Kapton masks at the tip of the rod were charred. The extensive spalling and charring of the Kapton tape are indicative of substrate temperatures in excess of 350° C.

Example 2

The apparatus used in Example 1 was modified to incorporate electronic masking of the present invention. All exposed surfaces of the aluminum block and the electrode surface were covered with a tightly fitting 3 mm thick polycarbonate enclosure. Aluminum foil was placed over the entire polycarbonate enclosure and then wrapped over the edges and onto the dark space shield of the powered electrode. Holes were made in the electronic mask matching those in the block. Each hole in the foil was enlarged to expose a 2 mm annulus of polycarbonate, and then the edge of the foil and the exposed polycarbonate were covered with Kapton tape. One twist drill and one rod, both of the types described in Example 1, were inserted in the masked block, and the chamber was evacuated. A flow of 28 sccm argon was established, and 300 W of RF power was applied. The exposed surfaces of the drill and rod were uniformly enveloped by a bright plasma, while the glow on all other surfaces was very dim. Throughout this experiment the pump throttle was wide open, and the pressure remained in the 20–30 mTorr range. The substrates were first exposed to 5 minutes of sputter cleaning, then 21 minutes interlayer deposition from a mixture of 28 sccm argon and 26 sccm tetramethylsilane, and finally 24 minutes of DLC deposition from 100 sccm cyclohexane. The chamber was vented immediately after the end of the run. In comparison to Example 1, the mounting block was cool to the touch, but the substrates were too hot to remove immediately. Temperature tabs on the substrates indicated that the temperature at the tip of the rod exceeded 260° C., but an adherent, uniform, shiny black coating was deposited over the entire exposed surface on the drill, including the inner portions of the flutes. The coating measured 5.4 μm at the tip of the rod, and 5.9 μm at ~1 cm from the mounting block.

In Examples 3, 4 and 5, the effect of the type of masking (electronic, dielectric, and none, respectively) on substrate temperature and rate of spurious deposition on the mounting fixture were measured during Si-DLC deposition on batches of printed wire board drills. The RF power was adjusted in each run to obtain the same DC bias, while other discharge parameters, such as gas flows, pressure and deposition time, were identical. Similar coating thicknesses on and in the flutes of the drills, in the range of 20–30 micrometers, were obtained in all three runs. The results of Examples 3, 4 and 5, which are compiled in Table I below, demonstrate that because of reduced electrical power consumption, reduced substrate temperature, reduced rate of spurious deposition, and lack of dust production during the run, the electronic masking method of the present invention is clearly superior to both the dielectric masking and no masking approaches of the prior art.

coating was deposited on the drills and the rods, which was difficult to abrade with coarse silicon carbide sandpaper.

TABLE I

Comparison of Coating Results of Examples 3, 4 and 5
(DC bias voltage was approximately −575 V.)

| Ex. No. | Type of Masking | Input Power(W) | Fixture Temp.(°C.) | Rod Temp.(°C.) | Rate of Spurious Deposition on Fixture(μm/hr) | Spalling on Fixture? |
|---|---|---|---|---|---|---|
| 3 | Electronic | 251 | 68 | $121 > T_R > 49$ | 3.0 | no |
| 4 | Dielectric | 264 | 124 | $199 > T_R > 121$ | 7.1 | yes |
| 5 | None | 350 | 191 | $T_R > 232$ | 7.6 | yes |

$T_R$ = Rod temperature measured by temperature indicating tabs.

Example 3

An all-metal RF plasma chamber with a 17 cm diameter powered electrode was used to deposit Si-DLC coatings on a batch of 52 cobalt-cemented tungsten carbide printed wire board drills. Each drill had a total length of approximately 4 cm, a shank diameter of approximately 0.3 cm, and a flute diameter of approximately 0.016 inches. The drills were mounted vertically in a disk shaped fixture with 54 evenly spaced holes. The fixture consisted of a 1.3 cm thick aluminum mounting block, a 1.25 cm thick polycarbonate spacer, and a 0.3 cm thick aluminum grounded shield plate enclosure which fit snugly over the perimeter of the dark space shield. The through holes in the grounded shield plate which allowed penetration of the drill tips and flutes into the plasma had a diameter of 0.43 cm, and were evenly spaced in a rectangular packing arrangement across the plate, with a center-to-center spacing of approximately 1.9 cm. A 0.6 cm thick strip of teflon on the inside of the aluminum enclosure prevented contact between it and the aluminum mounting block. In addition to the drills, two 0.3 cm diameter rods were placed in the remaining holes, with temperature tabs taped along the length of one. The drills and rods extended 1.3 cm and 2.5 cm, respectively, above the top of the grounded shield plate. Temperature indicating tabs were also taped to the outer surface of the grounded enclosure between substrate holes. Furthermore, two small flat samples (one silicon, the other stainless steel) with Kapton masks were placed on the surface of the grounded shield plate between substrates. These "witness samples" enabled accurate measurement of the spurious coating thickness. After the fixture was in place on the powered electrode, and all the substrates were loaded, the chamber was evacuated. A flow of 25 sccm argon was introduced and a plasma was ignited. The loaded fixture was sputter-cleaned for 20 minutes under constant conditions (29 mTorr pressure, 229 W RF power, and −551 V DC bias). A Si-DLC coating was then deposited from a mixture of 25 sccm of tetramethylsilane and 25 sccm argon. Deposition continued for 60 minutes, at a DC bias of −576 V, which required 251 W input power. The chamber was immediately vented at the conclusion of the deposition step. The fixture and the parts were warm to the touch. There was no apparent deposition on the fixture, but profilometry across the masked areas on the witness samples indicated 3.0 micrometers of a clear coating material had been deposited. The soft coating was easily scratched with fine steel wool. Plasma coatings this soft are essentially free of internal stresses and can be deposited to great thicknesses in multiple runs without spalling. Indeed, no spalling, and no evidence of particulate formation was found. A low friction, black, shiny and uniform Si-DLC coating was deposited on the drills and the rods, which was difficult to abrade with coarse silicon carbide sandpaper.

Example 4

(Control 2)

The deposition process described in Example 3 was repeated, but the masking was changed from electronic to dielectric by removing the grounded shield plate. The drills in this case extended 1.6 cm above the top of the polycarbonate disk, but slightly shorter rods were used so that the exposed length remained 2.5 cm. The same number of drill bits, steel rods, witness samples and temperature indicating tabs were loaded in the fixture. The chamber was evacuated and the run carried out under the same conditions as in Example 3. Compared to Example 3, more RF power was required to achieve the same bias voltage, as is shown in Table I. The chamber was immediately vented at the conclusion of the run. Both the polycarbonate layer and the steel rods were much warmer to the touch than in Example 3. The polycarbonate layer was coated with a brown colored coating, which spalled in some areas. There was also some surface melting of the polycarbonate near the holes. As a result of the spalling there was an abundance of particulate on and around the drill bits, rods, and witness samples. The coating on the witness samples measured 7.1 micrometers and was purple in color. It could not be abraded with steel wool, but was easily abraded with fine silicon carbide sand paper. The drills and rods were coated with material similar in appearance and abrasion performance to the chafing on the substrates in the Example 3.

Example 5

(Control 3)

The deposition process described in Example 3 was repeated, but without any type of mask on the aluminum mounting block. The drills extended 2.9 cm above the top of the mounting block part holder. Shorter rods were used so that 2.5 cm of the rod was exposed. After mounting the witness samples and the temperature indicating tabs in the same configuration as in Example 3, the loaded aluminum mounting block was placed on the electrode, and the chamber was evacuated. The deposition process was carried out under the same conditions as in Example 3. As indicated in Table I, more RF power was required to maintain the same DC bias. The chamber was vented immediately at the end of the run. Both the fixture and the substrates were too hot to touch. A black coating covered the fixture and began to spall during the run, and particulate levels were even higher than in the Example 4. The coating on the witness slides was also black, and measured 7.6 micrometers thick. This coating was difficult to abrade with free silicon carbide paper, and thus likely to be under higher compressive stress that the spurious coatings in Examples 3 and 4. The coating on the drills and the rods was similar in appearance and abrasion performance to that deposited on the substrates in Examples 3 and 4, however, the coating at the base of one rod was spalling.

Examples 6 and 7 compare the coating uniformity achieved on large batches of printed wire board drills with and without the aid of electronic masking, respectively. The RF power was adjusted in each run to obtain the same DC bias, while other discharge parameters, such as gas flows, pressure and deposition time, were similar. These examples show that when compared to the prior art techniques, the part-to-part coating uniformity, from the center of the fixture to the outer edge of the fixture, is superior when the electronic masking method of the present invention is used.

Example 6

An electronically masked parts holder, similar in configuration to the parts holder described in Example 3, but with higher packing density, was used to coat 120 cobalt-cemented tungsten carbide printed wire board drills. Again, each drill had a total length of approximately 4 cm, a shank diameter of approximately 0.3 cm, and a flute diameter of approximately 0.016 inches. The drills were mounted vertically in a disk shaped fixture with 120 evenly spaced holes. The fixture consisted of a 1.3 cm thick aluminum mounting block, a 0.95 cm thick boron nitride spacer, and a 0.3 cm thick aluminum grounded shield plate enclosure which fit snugly over the perimeter of the dark space shield. The through holes in the grounded shield plate which allowed penetration of the drill tips and flutes into the plasma had a diameter of 0.43 cm, and were evenly spaced in a rectangular packing arrangement across the plate with a center-to-center hole spacing of approximately 1.3 cm. A 0.6 cm thick strip of teflon on the inside of the aluminum enclosure prevented contact between it and the aluminum mounting block. The drills extended approximately 1.4 cm above the top of the grounded shield plate.

After the fixture was loaded and placed on the powered electrode in the all-metal RF chamber, the chamber was evacuated, and 25 sccm argon was introduced. A plasma was ignited and the fixture was sputter-cleaned at a constant bias voltage of −550 V. After 20 minutes of sputter-cleaning, a an Si-DLC coating was deposited by mixing 25 sccm tetramethylsilane with 25 sccm argon. The bias voltage was increased to −575 V, and deposition continued for 8 minutes. The chamber was vented immediately after the end of the deposition. Two drills, one each from the center and the perimeter of the fixture were then removed and analyzed. Each drill was fractured through the flutes, and the coating thickness was determined by examination of the fracture cross-section in a scanning electron microscope. Coating thickness was measured on the inner recesses of the flutes and on the outer surface of the drills. The coating thicknesses were found to vary only slightly between drills coated at the center and on the perimeter of the fixture. The drill coated at the center of the fixture had a coating thickness of 3.1 micrometers on the exterior surface of the flutes, and 4.1 micrometers on the inner recesses of the flutes. The drill coated at the perimeter of the fixture had a coating thickness of 3.4 micrometers on the exterior surface of the flutes, and 3.7 micrometers on the inner recesses of the flutes. Therefore, the coating variation from the center to the perimeter of the fixture was only approximately 10%.

Example 7

(Control 4)

The deposition process described in Example 6 was repeated without any type of mask on the fixture. The bare aluminum disk was loaded with 120 printed wire board drills, and was then placed on the powered electrode. The chamber was then evacuated and a plasma was ignited. The process conditions in this run were the same as those in Example 6, with the exception that the deposition step was allowed to run for 9 minutes. After the deposition was terminated, the chamber was vented. Two drills, one each from the center and the perimeter of the fixture, were analyzed using a scanning electron microscope. Variation in part-to-part coating thickness with location on the fixture was much more pronounced. The drill located at the center of the fixture had a coating thickness of 6.2 micrometers on the exterior surface of the flutes, and 7.9 micrometers on the inner recesses of the flutes. The drill coated at the outer edge of the fixture had a coating thickness of 4.0 micrometers on the exterior surface of the flutes, and 6.7 micrometers on the inner recesses of the flutes. Therefore, the variation in the Si-DLC coating thickness from the center to the perimeter of the fixture was approximately 15-35%. The uniformity of coating thickness was much poorer than that found in Example 6.

The uniformity and coverage of Si-DLC coatings deposited onto the surface of 0.0016-inch diameter cemented tungsten carbide printed wire board drills is illustrated in the photomicrographs of FIGS. 5 and 6. The drills shown in FIGS. 5 and 6 were coated with a layer of Si-DLC in an electronically masked fixture similar to that described in Example 3, except 101 holes were prepared in the aluminum mounting plate, polycarbonate dielectric spacer, and aluminum grounded shield plate to enable coating of 101 microdrills per run. The through holes in the grounded shield plate which allowed penetration of the drill tips and flutes into the plasma had a diameter of 0.43 cm, and were evenly spaced in a rectangular packing arrangement across the plate, with a center-to-center spacing of approximately 1.4 cm. The Si-DLC coating was prepared under conditions similar to those described in Example 3, except the deposition time was approximately 8 minutes. FIGS. 5 and 6 are 150× magnification fracture cross-section photomicrographs which illustrates the Si-DLC coating thickness uniformity obtained on microdrills coated at the outer edge of the coating fixture (see FIG. 5) and at the center of the coating fixture (see FIG. 6). FIG. 5 illustrates that for the drill coated near the edge of the electronically masked fixture, a coating thickness of 8.3 micrometers was obtained in the deepest recesses of the flutes, and a thickness of 6.8 micrometers was obtained on the outer portions of the flutes. FIG. 6 illustrates that for the drill coated in the center of the electronically masked fixture, a coating thickness of 9 micrometers was obtained in the deepest recesses of the flutes, and a thickness of 7.5 micrometers was obtained on the outer portions of the flutes. It is evident that the Si-DLC coatings exhibit excellent coverage and uniformity on both drills.

In drilling tests with printed circuit boards, the Si-DLC coated cemented tungsten carbide microdrills exhibited excellent performance. The enhanced performance of the Si-DLC coated drills compared to uncoated cemented tungsten carbide microdrills is believed to arise primarily from reduced friction in the flutes of the coated drills, which facilitates rejection of drilling chips.

From the foregoing description, one of ordinary skill in the art can easily ascertain that the present invention provides a novel method for producing high quality coatings of DLC and related materials onto the surfaces of drills. Highly important technical advantages of the present invention include (a) complete absence of undesirable deposition on the powered electrode and substrate holders, and a greatly reduced rate of spurious deposition, (b) much lower propensity for dust and debris formation (and therefore longer operation between chamber cleanup), (c) lower electrical power consumption, (d) less total heat generated, and therefore lower substrate temperatures resulting in improved coating adhesion and less degradation of the mechanical properties of the substrates, and (e) improved part-to-part coating uniformity within a single run.

What is claimed is:

1. A radio frequency plasma chamber for the deposition of a low-friction, abrasion-resistant coating on electrically conducting drills, which comprises:

(a) an electrically conductive mounting means within said plasma chamber for mounting at least one of the drills, said mounting means being connected to a source of capacitively coupled radio frequency power to induce a DC bias voltage in the drill;

(b) a grounded electrically conducting shield plate distal to said mounting means, said shield plate having at least an opening through which the portion of the drill to be coated extends into a plasma generated within said chamber for coating said portion with amorphous diamond-like carbon; and (c) an electrically insulating spacer separating said mounting means from said grounded shield plate to substantially limit current from flowing between said mounting means and said shield plate.

2. The plasma chamber of claim 1 wherein said opening in said electrically conducting shield plate has a sufficient diameter relative to the diameter of the drill to form an annular space that minimizes deposition of a coating on said spacer and avoids a short circuit between said shield and the drill.

3. The plasma chamber of claim 1 wherein an electrically insulating layer having an orifice encircles a portion of the drill adjacent to said electrically conducting shield, the orifice conforming to the shape of the encircled portion of said drill.

4. The plasma chamber of claim 1 wherein said drill has a tip at one end, a shank adjacent the other end and a fluted region between the tip and the shank and only the fluted region is extended into the plasma for coating thereon.

5. The plasma chamber of claim 4 wherein the drill is a microdrill having a maximum fluted region diameter in the range of about 0.0025 to about 0.03 inches.

6. The plasma chamber of claim 1 wherein the drill is a microdrill having a maximum fluted region diameter of in the range of about 0.0025 to about 0.03 inches.

7. The plasma chamber of claim 4 wherein an electrically insulating layer having an orifice encircles a portion of the shank adjacent to said electrically conducting shield, the orifice conforming to the shape of the encircled portion of said shank.

8. The plasma chamber of claim 4 wherein an electrically insulating layer with an orifice encircles a portion of the fluted region proximal to the shank adjacent said electrically conducting shield, the orifice conforming to the shape of the encircled portion of said fluted region.

9. A radio frequency plasma chamber for the deposition of a low friction, abrasion-resistant coating on a plurality of electrically conducting drills, which comprises:

(a) an inlet in said plasma chamber for precursor gases;

(b) an outlet for directing gases from said plasma chamber;

(c) an electrically conducting mounting means within said chamber for mounting the drills, said mounting means being connected to a source of capacitively coupled radio frequency power to induce a DC bias voltage in the drill;

(d) a grounded electrically conducting shield plate distal to said mounting means, said shield plate having a plurality of openings through which the portions of the drills to be coated extend into a plasma generated from the precursor gases within said chamber for coating said portions with amorphous diamond-like carbon; and (e) an electrically insulating spacer separating said mounting means from said grounded shield plate to substantially prevent current from flowing between said mounting means and said shield plate.

10. The plasma chamber of claim 9 wherein each of said plurality of openings in said electrically conducting shield plate has a sufficient diameter relative to the diameter of the drills to form an annular space that minimizes deposition of a coating on said spacer and avoids a short circuit between said shield and the drills by direct contact.

11. A method for depositing a low friction, abrasion resistant coating on electrically conducting drills comprising the steps of:

(a) chemically cleaning the exterior surface of said drills to remove contaminants;

(b) mounting the cleaned drills into a mounting means on an electrically conducting electrode connected to a source of capacitively coupled radio frequency power to induce a DC bias voltage in the drills within a plasma deposition chamber;

(c) electronically masking the mounting means, the electrode and a portion of the drills with a combination of an electrically grounded shield and an electrically insulated spacer;

(d) evacuating said chamber;

(e) introducing an inert gas into the evacuated deposition chamber, (f) igniting a radio frequency plasma;

(g) sputter-etching with said plasma to remove residual contaminants from the exposed surface of the drills and to activate said exposed surface;

(h) radio frequency depositing with precursor gases an amorphous diamond-like carbon coating onto said exposed surface of the drills without substantially depositing on the unexposed surface of the drills, the holder and electrode; and (i) recovering said drills uniformly coated, with a low friction, abrasion-resistant coating.

12. The method of claim 11 wherein said precursor gases comprise hydrocarbons to deposit a diamond-like carbon coating.

13. The method of claim 11 wherein said precursor gases comprise silicon-containing materials to deposit a silicon-doped diamond-like carbon coating.

14. The method of claim 11 wherein said contaminants are selected from the group consisting of residual hydrocarbons and surface oxides.

15. The method of claim 11 wherein the electronically masking comprises a grounded electrically conducting plate and an electrically insulating spacer positioned between the conducting plate and the electrode.

16. The method of claim 11 wherein said conducting plate has a plurality of spaced orifices which the exposed surfaces of the drills pass through and extend into said deposition chamber.

17. The method of claim 15 wherein a finite annular gap encircles the exposed surface of said drills and said conducting plate to minimize deposition on said spacer and to maximize avoidance of short circuiting.

18. The method of claim 11 wherein each of said drills has a tip at one end a shank adjacent the other end and a fluted region between the tip and the shank; each end of the drills adjacent the shank is mounted in one of a plurality of holes in said mounting means and the tip and at least the entire fluted region of the drill extend into the plasma; and each of the openings in said electrically conducting shield plate has a diameter slightly larger than the diameter of the shank to form an annular space that minimize deposition of a coating on said spacer and avoids a short circuit between said shield and the shank by direct contact.

19. The method of claim 18 wherein said drills are microdrills having a maximum fluted region diameter in the range of about 0.0025 to about 0.03 inches.

20. The method of claim 11 wherein the drill is a microdrill having a maximum fluted region diameter in the range of about 0.0025 to about 0.03 inches.

21. The method of claim 18 wherein said electronically masking step includes placing an electrically insulating layer having an orifice to encircle each of the shanks adjacent to said electrically conducting shield, said orifice conforming to the shape of the encircled shank.

22. The method of claim 18 wherein said electronically masking step includes placing an electrically insulating layer having an orifice to encircle each of the fluted regions proximal to the shanks, said orifice conforming to the shape of the encircled shank.

23. The method of claim 11 wherein said precursor gases comprise metal containing materials to deposit a metal-doped diamond-like carbon coating.

* * * * *

UNITED STATES PATENT AND TRADEMARK OFFICE
CERTIFICATE OF CORRECTION

PATENT NO. : 5,653,812
DATED : August 5, 1997
INVENTOR(S) : Petrmichl, *et al.*

It is certified that error appears in the above-indentified patent and that said Letters Patent is hereby corrected as shown below:

Column 1, line 48, delete "arc" and insert therefor --art--.

Column 6, line 9, delete "RE" and insert therefor --RF--.

Column 8, line 48, after "C" delete ".".

Column 10, line 44, delete "chafing" and insert therefor --coating--.

Column 10, line 66, delete "free" and insert therefore --fine--.

Column 11, line 46, after "sputter-cleaning," delete "a".

Column 15, line 2, delete "comprises" and insert therefor --step uses electronic masking comprising--.

Signed and Sealed this

Eleventh Day of August 1998

*Attest:*

BRUCE LEHMAN

*Attesting Officer*  Commissioner of Patents and Trademarks